US012136938B2

(12) United States Patent
Juco et al.

(10) Patent No.: US 12,136,938 B2
(45) Date of Patent: Nov. 5, 2024

(54) CLOSED-LOOP MULTIPLE-OUTPUT RADIO FREQUENCY (RF) MATCHING

(71) Applicant: Lam Research Corporation, Fremont, CA (US)

(72) Inventors: Eller Y. Juco, San Jose, CA (US); Karl Frederick Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 260 days.

(21) Appl. No.: 17/594,906

(22) PCT Filed: Apr. 30, 2020

(86) PCT No.: PCT/US2020/030835
§ 371 (c)(1),
(2) Date: Nov. 2, 2021

(87) PCT Pub. No.: WO2020/227028
PCT Pub. Date: Nov. 12, 2020

(65) Prior Publication Data
US 2022/0190854 A1 Jun. 16, 2022

Related U.S. Application Data

(60) Provisional application No. 62/844,668, filed on May 7, 2019.

(51) Int. Cl.
*H04B 1/04* (2006.01)
*G01R 27/06* (2006.01)
*H01J 37/32* (2006.01)

(52) U.S. Cl.
CPC ............ *H04B 1/0483* (2013.01); *G01R 27/06* (2013.01); *H01J 37/32183* (2013.01); *H01J 37/32935* (2013.01); *H01J 2237/3321* (2013.01)

(58) Field of Classification Search
CPC . H04B 1/0483; G01R 27/06; H01J 37/32183; H01J 37/32935; H01J 2237/3321
See application file for complete search history.

(56) References Cited

U.S. PATENT DOCUMENTS 3,995,237 A 11/1976 Brunner
4,044,357 A 8/1977 Goldie
(Continued)

FOREIGN PATENT DOCUMENTS

CN 1233147 A 10/1999
CN 1619767 A 5/2005
(Continued)

OTHER PUBLICATIONS

Chinese First Office Action dated Aug. 27, 2015 issued in Application No. CN 201310467492.0.
(Continued)

*Primary Examiner* — Junpeng Chen
(74) *Attorney, Agent, or Firm* — Weaver Austin Villeneuve & Sampson LLP

(57) ABSTRACT

An apparatus and method for performing closed-loop multiple-output control of radio frequency (RF) matching for a semiconductor wafer fabrication process is provided. An apparatus for providing signals to a station of a process chamber performs semiconductor fabrication processes. A plurality of signal generators generates signals having first and second frequencies. A measurement circuit measures a voltage standing wave ratio (VSWR). A match reflection optimizer has a reactive component configured to be adjusted responsive to an output signal from the measurement circuit.

20 Claims, 10 Drawing Sheets

(56) References Cited

U.S. PATENT DOCUMENTS

| | | |
|---|---|---|
| 5,155,547 A | 10/1992 | Casper et al. |
| 5,195,045 A | 3/1993 | Keane et al. |
| 5,314,603 A | 5/1994 | Sugiyama et al. |
| 5,369,795 A | 11/1994 | Yanagimoto |
| 5,499,384 A | 3/1996 | Lentz et al. |
| 5,572,170 A | 11/1996 | Collins et al. |
| 5,580,385 A | 12/1996 | Paranjpe et al. |
| 5,643,364 A | 7/1997 | Zhao et al. |
| 5,770,922 A | 6/1998 | Gerrish et al. |
| 5,866,985 A | 2/1999 | Coultas et al. |
| 5,897,713 A | 4/1999 | Tomioka et al. |
| 6,020,794 A | 2/2000 | Wilbur |
| 6,028,014 A | 2/2000 | Sukjarev |
| 6,054,013 A | 4/2000 | Collins et al. |
| 6,068,784 A | 5/2000 | Collins et al. |
| 6,251,792 B1 | 6/2001 | Collins et al. |
| 6,288,493 B1 | 9/2001 | Lee et al. |
| 6,388,226 B1 | 5/2002 | Smith et al. |
| 6,444,137 B1 | 9/2002 | Collins et al. |
| 6,447,636 B1 | 9/2002 | Qian et al. |
| 6,518,195 B1 | 2/2003 | Collins et al. |
| 6,815,633 B1 | 11/2004 | Chen et al. |
| 6,887,339 B1 | 5/2005 | Goodman et al. |
| 6,922,324 B1 | 7/2005 | Horwitz |
| 6,939,434 B2 | 9/2005 | Collins et al. |
| 7,042,311 B1 | 5/2006 | Hilliker et al. |
| 7,777,152 B2 | 8/2010 | Todorov et al. |
| 8,179,050 B2 | 5/2012 | Chen |
| 8,190,380 B2 | 5/2012 | Choueiry et al. |
| 8,368,308 B2 | 2/2013 | Banna et al. |
| 8,617,351 B2 | 12/2013 | Hoffman et al. |
| 9,082,589 B2 | 7/2015 | Thomas et al. |
| 9,518,554 B2 | 12/2016 | Mongin et al. |
| 9,526,161 B2 | 12/2016 | Habu |
| 9,704,692 B2 | 7/2017 | Leeser |
| 9,773,643 B1 | 9/2017 | Singhal et al. |
| 9,779,196 B2 | 10/2017 | Valcore, Jr. et al. |
| 9,918,376 B2 | 3/2018 | Thomas et al. |
| 10,950,421 B2 | 3/2021 | Valcore, Jr. |
| 11,527,385 B2 | 12/2022 | Maw et al. |
| 11,756,768 B2 | 9/2023 | Hasegawa et al. |
| 2001/0042594 A1 | 11/2001 | Shamouilian et al. |
| 2001/0054383 A1 | 12/2001 | Pu et al. |
| 2002/0023899 A1 | 2/2002 | Khater et al. |
| 2002/0180534 A1* | 12/2002 | Bohn ............ H03F 1/565 330/302 |
| 2003/0146803 A1 | 8/2003 | Pickard et al. |
| 2003/0157812 A1 | 8/2003 | Narwankar et al. |
| 2004/0032212 A1 | 2/2004 | Yuzurihara et al. |
| 2004/0195972 A1 | 10/2004 | Cornelius |
| 2005/0001556 A1 | 1/2005 | Hoffman et al. |
| 2005/0069651 A1 | 3/2005 | Miyoshi et al. |
| 2005/0106873 A1 | 5/2005 | Hoffman et al. |
| 2005/0134186 A1 | 6/2005 | Brouk et al. |
| 2005/0205532 A1 | 9/2005 | Patrick et al. |
| 2006/0116106 A1 | 6/2006 | Turner |
| 2007/0153780 A1 | 7/2007 | Stanley |
| 2007/0251920 A1 | 11/2007 | Hoffman |
| 2008/0106206 A1 | 5/2008 | Hooke et al. |
| 2008/0179948 A1 | 7/2008 | Nagarkatti et al. |
| 2009/0278512 A1 | 11/2009 | Karlicek et al. |
| 2009/0289630 A1 | 11/2009 | Nascimento et al. |
| 2010/0025384 A1 | 2/2010 | Todorow et al. |
| 2010/0171427 A1 | 7/2010 | Kirchmeier et al. |
| 2011/0063042 A1 | 3/2011 | Mendolia et al. |
| 2011/0101862 A1 | 5/2011 | Koo et al. |
| 2011/0140607 A1 | 6/2011 | Moore et al. |
| 2011/0148303 A1 | 6/2011 | Van Zyl et al. |
| 2011/0214811 A1 | 9/2011 | Ashida |
| 2012/0074844 A1 | 3/2012 | York et al. |
| 2012/0212135 A1 | 8/2012 | Suzuki |
| 2012/0247679 A1 | 10/2012 | Yamazawa |
| 2012/0298303 A1 | 11/2012 | Ikeda et al. |
| 2013/0105082 A1 | 5/2013 | Melikyan et al. |
| 2013/0234741 A1* | 9/2013 | Mow ............ H01Q 5/328 324/750.01 |
| 2014/0008357 A1 | 1/2014 | Cheng et al. |
| 2014/0062303 A1 | 3/2014 | Hoffman et al. |
| 2014/0087668 A1* | 3/2014 | Mow ............ H04W 24/08 455/67.14 |
| 2014/0097751 A1 | 4/2014 | Thomas et al. |
| 2014/0155008 A1* | 6/2014 | Van Zyl ............ H01J 37/32155 455/120 |
| 2014/0231389 A1 | 8/2014 | Nagami et al. |
| 2015/0221478 A1 | 8/2015 | Himori et al. |
| 2015/0313000 A1 | 10/2015 | Thomas et al. |
| 2015/0340204 A1 | 11/2015 | Kudela et al. |
| 2015/0348854 A1 | 12/2015 | Kapoor et al. |
| 2015/0371876 A1 | 12/2015 | Terauchi et al. |
| 2016/0065207 A1 | 3/2016 | Bhutta |
| 2016/0113103 A1 | 4/2016 | Van Zyl |
| 2017/0117869 A1 | 4/2017 | Leeser et al. |
| 2017/0244582 A1 | 8/2017 | Gal et al. |
| 2017/0330732 A1 | 11/2017 | Valcore, Jr. et al. |
| 2017/0330744 A1 | 11/2017 | Keil et al. |
| 2017/0345620 A1 | 11/2017 | Coumou et al. |
| 2017/0365907 A1 | 12/2017 | Kapoor et al. |
| 2017/0372870 A1 | 12/2017 | Godyak et al. |
| 2018/0023158 A1 | 1/2018 | Sasaki et al. |
| 2018/0068834 A1 | 3/2018 | Valcore, Jr. et al. |
| 2018/0097520 A1 | 4/2018 | Wu |
| 2018/0163302 A1 | 6/2018 | Kapoor et al. |
| 2018/0231587 A1 | 8/2018 | Ye et al. |
| 2018/0261431 A1 | 9/2018 | Hammond, IV et al. |
| 2018/0308663 A1* | 10/2018 | Collins ............ H01J 37/32137 |
| 2018/0351322 A1 | 12/2018 | Kurosawa et al. |
| 2018/0366378 A1 | 12/2018 | Kim et al. |
| 2019/0049534 A1 | 2/2019 | Guan |
| 2019/0051496 A1* | 2/2019 | Collins ............ H01J 37/32165 |
| 2019/0068158 A1 | 2/2019 | Coumou et al. |
| 2019/0108979 A1 | 4/2019 | Higuchi |
| 2019/0149119 A1 | 5/2019 | Kapoor et al. |
| 2019/0288737 A1 | 9/2019 | Hanks et al. |
| 2020/0010957 A1 | 1/2020 | Chen et al. |
| 2020/0126762 A1 | 4/2020 | Yang et al. |
| 2020/0333434 A1 | 10/2020 | Chancey et al. |
| 2021/0302478 A1 | 9/2021 | Kapoor et al. |
| 2021/0313948 A1 | 10/2021 | Leeser et al. |
| 2022/0328236 A1 | 10/2022 | Kapoor |
| 2022/0344129 A1 | 10/2022 | Kapoor |
| 2022/0375721 A1 | 11/2022 | Fields et al. |
| 2022/0415616 A1 | 12/2022 | Juco et al. |
| 2023/0052543 A1 | 2/2023 | Linebarger, Jr. et al. |
| 2023/0223238 A1 | 7/2023 | Guo et al. |
| 2023/0326720 A1 | 10/2023 | Mopidevi et al. |

FOREIGN PATENT DOCUMENTS

| | | |
|---|---|---|
| CN | 1656593 A | 8/2005 |
| CN | 1925322 A | 3/2007 |
| CN | 101630624 A | 1/2010 |
| CN | 101866808 A | 10/2010 |
| CN | 101933225 A | 12/2010 |
| CN | 102037789 A | 4/2011 |
| CN | 103533690 A | 1/2014 |
| CN | 105321792 A | 2/2016 |
| CN | 109659215 A | 4/2019 |
| EP | 0840350 A2 | 5/1998 |
| EP | 0935406 A2 | 8/1999 |
| EP | 2881579 B1 | 3/2019 |
| GB | 1599557 A | 10/1981 |
| JP | H0589997 A | 4/1993 |
| JP | H08274067 A | 10/1996 |
| JP | H11233294 A | 8/1999 |
| JP | 2001057360 A | 2/2001 |
| JP | 2003302431 A | 10/2003 |
| JP | 2005527078 A | 9/2005 |
| JP | 2006019716 A | 1/2006 |
| JP | 4352562 B2 | 10/2009 |
| JP | 2014142266 A | 8/2014 |
| JP | 2014186994 A | 10/2014 |
| JP | 2016009733 A | 1/2016 |
| JP | 2018011050 A | 1/2018 |

(56) References Cited

FOREIGN PATENT DOCUMENTS

| | | |
|---|---|---|
| JP | 2019504481 A | 2/2019 |
| JP | 2019071270 A | 5/2019 |
| JP | 2019517125 A | 6/2019 |
| JP | 2019133785 A | 8/2019 |
| JP | 2020510959 A | 4/2020 |
| KR | 980012069 A | 4/1998 |
| KR | 20010015590 A | 2/2001 |
| KR | 20040084477 A | 10/2004 |
| KR | 20050029122 A | 3/2005 |
| KR | 20070101654 A | 10/2007 |
| KR | 20070109275 A | 11/2007 |
| KR | 20110116939 A | 10/2011 |
| KR | 20140104380 A | 8/2014 |
| KR | 20160000400 A | 1/2016 |
| KR | 20170054239 A | 5/2017 |
| KR | 101791706 B1 | 10/2017 |
| KR | 20170114800 A | 10/2017 |
| KR | 20180080631 A | 7/2018 |
| KR | 20180082626 A | 7/2018 |
| KR | 20190047404 A | 5/2019 |
| KR | 20190109559 A | 9/2019 |
| KR | 20200003561 A | 1/2020 |
| KR | 20200111233 A | 9/2020 |
| KR | 102505150 B1 | 2/2023 |
| TW | 200509194 A | 3/2005 |
| TW | I290331 B | 11/2007 |
| TW | 201141317 A | 11/2011 |
| TW | 201611153 A | 3/2016 |
| TW | 201903818 A | 1/2019 |
| TW | 201935596 A | 9/2019 |
| WO | WO-9534945 A2 | 12/1995 |
| WO | WO-9914855 A1 | 3/1999 |
| WO | WO-02080220 A1 | 10/2002 |
| WO | WO-03101160 A2 | 12/2003 |
| WO | WO-2005031839 A1 | 4/2005 |
| WO | WO-2009099486 A1 | 8/2009 |
| WO | WO-2011028600 A2 | 3/2011 |
| WO | WO-2017100136 A1 | 6/2017 |
| WO | WO-2018156486 A1 | 8/2018 |
| WO | WO-2018228133 A1 | 12/2018 |
| WO | WO-2019079325 A1 | 4/2019 |

OTHER PUBLICATIONS

Chinese First Office Action dated May 17, 2017 issued in Application No. CN 201610428220.3.
Chinese Second Office Action dated Mar. 5, 2018 issued in Application No. CN 201610428220.3.
Chinese Third Office Action dated Aug. 15, 2018 issued in Application No. CN 201610428220.3.
Co-pending U.S. Appl. No. 17/597,932, filed Jan. 28, 2022.
Co-pending U.S. Appl. No. 17/597,932, inventor Kapoor; Sunil, filed Jan. 28, 2022.
Final Office Action dated Jul. 7, 2017 issued in U.S. Appl. No. 14/737,377.
International Preliminary Report on Patentability dated Apr. 14, 2022 from PCT/US2020/053014.
International Preliminary Report on Patentability dated Feb. 10, 2022 issued in Application No. PCT/US2020/070333.
International Preliminary Report on Patentability dated Nov. 18, 2021, issued in PCT/US2020/030835.
International Search Report and Written Opinion dated Apr. 7, 2021 issued in Application No. PCT/US2020/062924.
International Search Report and Written Opinion dated Aug. 17, 2021 issued in Application No. PCT/US2021/030177.
International Search Report and Written Opinion dated Aug. 21, 2020 issued in Application No. PCT/US2020/030835.
International Search Report and Written Opinion dated Feb. 3, 2021 issued in Application No. PCT/US2020/057020.
International Search Report and Written Opinion dated Jan. 19, 2021, for International Application No. PCT/US2020/053014.
International Search Report and Written Opinion dated Jul. 15, 2021 issued in Application No. PCT/US2021/023942.
International Search Report and Written Opinion dated Jun. 4, 2021 issued in Application No. PCT/US2021/017227.
International Search Report and Written Opinion dated Nov. 11, 2020 issued in Application No. PCT/US2020/070333.
International Search Report and Written Opinion dated Sep. 27, 2021 issued in Application No. PCT/US2021/036163.
Korean Decision for Grant of Patent dated Jan. 18, 2020 issued in Application No. KR 10-2013-0120518.
Notice of Allowance dated Mar. 31, 2015 issued in U.S. Appl. No. 13/648,183.
Notice of Allowance dated Oct. 31, 2017 issued in U.S. Appl. No. 14/737,377.
Office Action dated Sep. 23, 2016 issued in U.S. Appl. No. 14/737,377.
Taiwanese Notice of Allowance dated Jan. 19, 2017 issued in Application No. TW 102136597.
U.S. Appl. No. 17/754,202, filed Mar. 25, 2022.
CN Office Action dated Oct. 11, 2023, in application No. CN202080056165.4 with English translation.
CN Office Action dated Oct. 24, 2023, in application No. CN202080034447.4 with English translation.
International Preliminary Report on Patentability and written opinion dated Aug. 25, 2022 in Application PCT/US2021/017227.
International Preliminary Report on Patentability and written opinion dated Nov. 17, 2022 in Application PCT/US2021/030177.
International Preliminary Report on Patentability dated Dec. 22, 2022, in PCT Application No. PCT/US2021/036163.
International Preliminary Report on Patentability dated Jan. 12, 2023, in PCT Application No. PCT/US2021/038457.
International Preliminary Report on Patentability dated Jun. 16, 2022, in PCT Application No. PCT/US2020/062924.
International Preliminary Report on Patentability dated Oct. 6, 2022 in PCT Application PCT/US2021/023942.
International Search Report and Written Opinion dated Dec. 16, 2022 in PCT Application No. PCT/US2022/030252.
International Search Report and Written Opinion dated Oct. 14, 2021, in application No. PCT/US2021/038457.
KR Office Action dated Aug. 4, 2022 in Application No. KR10-2022-7013719 With English translation.
KR Office Action dated Feb. 24, 2023 in Application No. KR10-2022-7025826 with English translation.
KR Office Action dated Jan. 16, 2024 in KR Application No. 10-2023-7006703 with English translation.
KR Office Action dated Sep. 21, 2022 in Application No. KR10-2022-7025826 with English translation.
PCT International Preliminary Report on Patentability dated May 5, 2022 issued in PCT/US2020/057020.
SG Search Report and Written Opinion dated Nov. 1, 2023 in SG Application No. 11202111969R.
SG Search Report and Written Opinion dated Nov. 15, 2023 in SG Application No. 11202202918X.
U.S. Non-Final Office Action dated Jul. 3, 2023, in U.S. Appl. No. 16/832,961.
U.S. Non-Final Office Action dated Mar. 8, 2024 in U.S. Appl. No. 17/597,932.
U.S. Notice of Allowance dated Feb. 6, 2024 in U.S. Appl. No. 16/832,961.
U.S. Notice of Allowance dated Jan. 12, 2024 in U.S. Appl. No. 17/756,058.
U.S. Notice of Allowance dated Jan. 23, 2024 in U.S. Appl. No. 17/756,058.
U.S. Notice of Allowance dated Oct. 20, 2023 in U.S. Appl. No. 16/832,961.
U.S. Appl. No. 17/907,067, inventors Kapoor et al., filed Sep. 22, 2022.
U.S. Restriction Requirement dated Feb. 24, 2023 in U.S. Appl. No. 16/832,961.
JP Office Action dated Apr. 30, 2024 in JP Application No. 2022-506171, with English Translation.
JP Office Action dated Jun. 11, 2024 in JP Application No. 2022-530889 with English translation.
JP Office Action dated May 7, 2024 in JP Application No. 2021-564697, with English Translation.

(56) References Cited

OTHER PUBLICATIONS

KR Office Action dated May 21, 2024 in KR Application No. 10-2019-0071320, with English Translation.
TW Office Action dated Apr. 3, 2024 in TW Application No. 109115006, with English Translation.
TW Office Action dated May 9, 2024 in TW Application No. 109125947, with English Translation.
TW Office Action dated May 22, 2024 in TW Application No. 109136856, with English translation.
U.S. Appl. No. 18/631,368, inventors Juco E.Y, et al., filed on Apr. 10, 2024.
U.S. Appl. No. 18/643,650, inventors Kapoor S, et al., filed on Apr. 23, 2024.

* cited by examiner

CLOSED-LOOP MULTIPLE-OUTPUT RADIO FREQUENCY (RF) MATCHING

BACKGROUND

Background and contextual descriptions contained herein are provided solely for the purpose of generally presenting the context of the disclosure. Much of this disclosure presents work of the inventors, and simply because such work is described in the background section or presented as context elsewhere herein does not mean that such work is admitted to be prior art.

Fabrication of semiconductor wafers utilized to form integrated circuits may include numerous and diverse processing steps. In certain processing steps, which may occur after various materials are deposited onto a semiconductor wafer, material may be etched away, so as to allow additional materials, such as metals, to be deposited. Such deposition may involve formation of conductive traces, transistor gates, vias, circuit elements, and so forth. However, in at least some instances, semiconductor fabrication processes, such as those involving plasma-based and/or etching plasma enhanced atomic layer deposition, uncontrollable process variations may bring about lower yields, increased costs, unwanted redesign of semiconductor layouts and masks, and so forth. Accordingly, techniques to increase control over plasma-based wafer etching and/or plasma enhanced atomic layer deposition continues to be an active area of investigation.

DETAILED DESCRIPTION

Figure 1A:
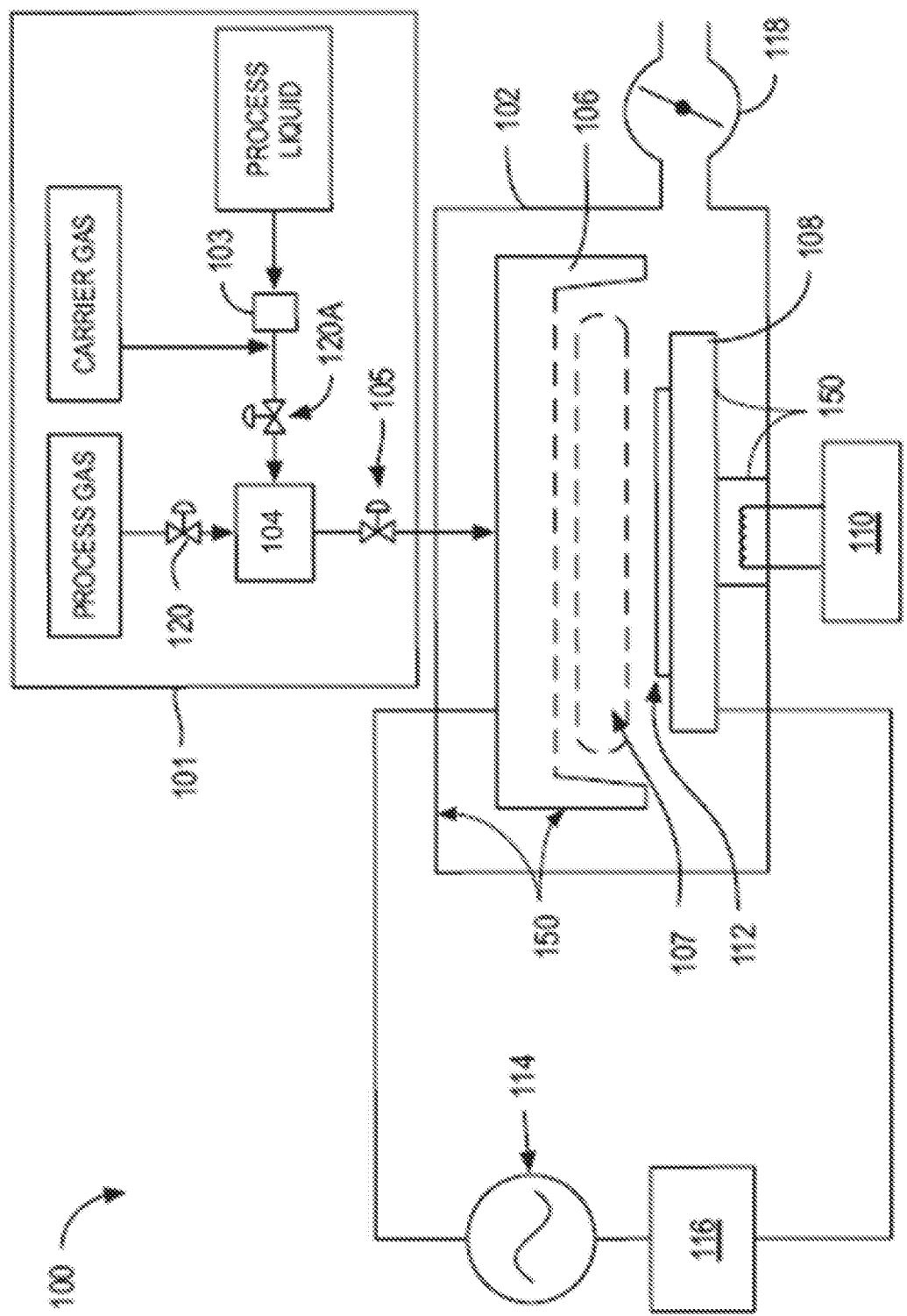
FIG. 1A shows a substrate processing apparatus for depositing films on semiconductor substrates utilizing any number of processes.

In particular implementations, closed-loop multiple-output radio frequency (RF) matching may be utilized in a variety of semiconductor fabrication processes, such as plasma-based wafer fabrication. Closed-loop multiple-output RF matching may bring about a capability to deliver RF power to one or more stations of a process chamber in a manner that permits dynamic adjustment to varying loads presented by the stations of the process chamber. Such dynamic adjustment provides a real-time capability to closely match the impedance of loads presented by the plasma within the stations to the source impedance of one or more RF power generators, even as such loads drift during the course of a fabrication process. Hence, RF delivered from individual stations can be dynamically increased, while RF power reflected from RF power generators may be reduced and/or minimized. Certain implementations may be utilized with a number of wafer fabrication processes, such as various plasma-enhanced atomic layer deposition (ALD) processes, various plasma-enhanced chemical vapor deposition (CVD) processes, or may be utilized on-the-fly during single deposition processes. In certain implementations, RF power matching networks utilize simplified circuit topologies to accommodate load changes at any signal frequency, such as 400 kHz and 27.12 MHz. However, in other implementations, RF power matching networks may operate at any signal frequency, such as at relatively low frequencies (e.g., between about 50 kHz and about 1 MHz, as well as higher signal frequencies (e.g., between about 10 MHz and about 100 MHz).

It should be noted that although particular implementations described herein may show and/or describe closed-loop multiple-output radio frequency matching for use with 4 stations of a process chamber, in other implementations, a smaller number of stations of a process chamber may be utilized, such as 1 station, 2 stations, or 3 stations. In other implementations closed-loop multiple-output radio frequency matching may be utilized with a larger number of stations of a process chamber, such as 5 stations, 6 stations, 7 stations, 8 stations, 10 stations, 12 stations, or any other number of stations of a process chamber.

Manufacturing of semiconductor devices typically involves depositing one or more thin films on a planar or non-planar substrate in an integrated fabrication process. In some aspects of the integrated process it may be useful to deposit thin films that conform to substrate topography. One type of reaction that is useful in some cases involves chemical vapor deposition (CVD). In typical CVD processes, gas-phase reactants are introduced into stations of a reaction chamber simultaneously and undergo a gas-phase reaction. The reaction products deposit on the surface of the substrate. The reaction may be driven by plasma, in which case the process may be referred to as a plasma-enhanced chemical vapor deposition (PECVD) reaction. As used herein, the term CVD is intended to include PECVD unless otherwise indicated. CVD processes have certain disadvantages that render them less appropriate in some contexts. For instance, mass transport limitations of CVD gas phase reactions may cause "bread-loafing" deposition effects that show thicker deposition at top surfaces (e.g., top surfaces of gate stacks) and thinner deposition at recessed surfaces (e.g., bottom corners of gate stacks). Further, because some die may have regions of differing device density, mass transport effects across the substrate surface may result in within-die and within-wafer thickness variations. These thickness variations can result in over-etching of some regions and under-etching of other regions, which can degrade device performance and die yield. Another problem related to CVD processes is that they are often unable to form conformal films in high aspect ratio features. This issue is increasingly problematic as device dimensions continue to shrink. These and other drawbacks of particular aspects of wafer fabrication processes are discussed in relation to FIG. 1A and FIG. 1B.

In another example, some deposition processes involve multiple film deposition cycles, each producing a discrete film thickness. For example, in atomic layer deposition (ALD), thin layers of film are used in a repeating sequential matter and may be viewed as involving multiple cycles of deposition. As device and features size continue to shrink in the semiconductor industry, and also as 3D devices structures become more prevalent in integrated circuit (IC) design, the capability of depositing thin conformal films (films of material having a uniform thickness relative to the shape of the underlying structure, even if non-planar) continues to gain importance. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple ALD cycles may then be used to build up a film of the desired thickness, and since each layer is thin and conformal, the resulting film substantially conforms to the shape of the underlying devices structure. In certain implementations, each ALD cycle includes the following steps:

Exposure of the substrate surface to a first precursor.

Purge of the reaction chamber in which the substrate is located.

Activation of a reaction of the substrate surface, typically with a plasma and/or a second precursor.

Purge of the reaction chamber in which the substrate is located.

The duration of each ALD cycle may typically be less than 25 seconds or less than 10 seconds or less than 5 seconds. The plasma exposure step (or steps) of the ALD cycle may be of a short duration, such as a duration of 1 second or less.

FIG. 1A shows a substrate processing apparatus for depositing films on semiconductor substrates using any number of processes. The apparatus 100 of FIG. 1A utilizes single processing station 102 of a process chamber with a single substrate holder 108 (e.g., a pedestal) in an interior volume which may be maintained under vacuum by vacuum pump 118. Also fluidically coupled to the process chamber for the delivery of (for example) film precursors, carrier and/or purge and/or process gases, secondary reactants, etc. is gas delivery system 101 and showerhead 106. Equipment for generating plasma within the process chamber is also shown in FIG. 1A. The apparatus schematically illustrated in FIG. 1A may be adapted for performing, in particular, plasma-enhanced CVD.

Figure 1B:
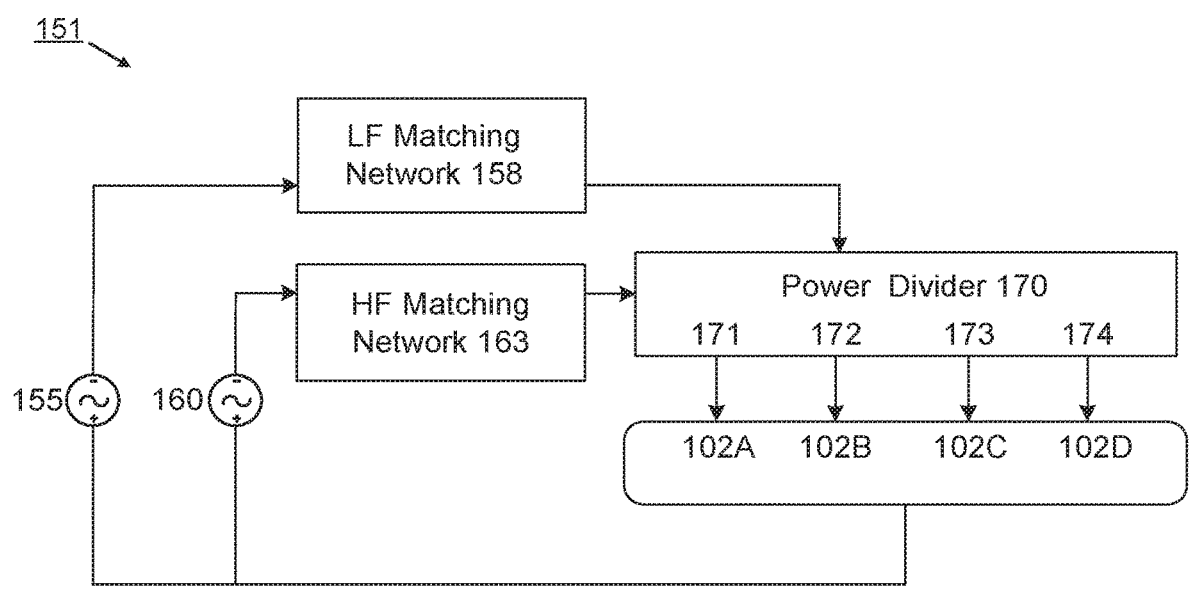
FIG. 1B is a block diagram showing various components of a system utilized to perform a semiconductor fabrication process, according to an implementation.

For simplicity, processing apparatus 100 is depicted as a standalone process station (102) of a process chamber for maintaining a low-pressure environment. However, it will be appreciated that a plurality of process stations may be included in a common process tool environment—e.g., within a common reaction chamber—as described herein. For example, FIG. 1B depicts an implementation of a multi-station processing tool and is discussed in further detail below. Further, it will be appreciated that, in some implementations, one or more hardware parameters of processing apparatus 100, including those discussed in detail herein, may be adjusted programmatically by one or more system controllers.

Station 102 of the process chamber fluidically communicates with gas delivery system 101 for delivering process gases, which may include liquids and/or gases, to a distribution showerhead 106. Gas delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to station 102 of a process chamber. The implementation of FIG. 1A includes a vaporization point 103 for vaporizing liquid reactant to be supplied to mixing vessel 104. In some implementations, vaporization point 103 may be a heated liquid injection module. In some other implementations, vaporization point 103 may be a heated vaporizer. In yet other implementations, vaporization point 103 may be eliminated from the process station. In some implementations, a liquid flow controller (LFC) upstream of vaporization point 103 may be provided for controlling a mass flow of liquid for vaporization and delivery to processing station 102.

Showerhead 106 distributes process gases and/or reactants (e.g., film precursors) toward substrate 112 at the process station, the flow of which is controlled by one or more valves upstream from the showerhead (e.g., valves 120, 120A, 105). In the implementation shown in FIG. 1A, substrate 112 is located beneath showerhead 106, and is shown resting on a pedestal 108. Showerhead 106 may have any suitable shape and may have any suitable number and arrangement of ports for distributing process gases to substrate 112. In some implementations with two or more stations, gas delivery system 101 includes valves or other flow control structures upstream from the showerhead, which can independently control the flow of process gases and/or reactants to each station such that gas may be flowed to one station but not another. Furthermore, gas delivery system 101 may be configured to independently control the process gases and/or reactants delivered to each station in a multi-station apparatus such that the gas composition provided to different stations is different; e.g., the partial pressure of a gas component may vary between stations at the same time.

A volume 107 is located beneath showerhead 106. In some implementations, pedestal 108 may be raised or lowered to expose substrate 112 to volume 107 and/or to vary a volume of volume 107. Optionally, pedestal 108 may be lowered and/or raised during portions of the deposition process to modulate process pressure, reactant concentration, etc., within volume 107.

In FIG. 1A, showerhead 106 and pedestal 108 are electrically coupled to radio frequency power supply 114 and matching network 116 for powering a plasma generator. In some implementations, the plasma energy may be controlled (e.g., via a system controller having appropriate machine-readable instructions and/or control logic) by controlling one or more of a process station pressure, a gas concentration, a source of RF power, and so forth. For example, radio frequency power supply 114 and matching network 116 may be operated at any suitable power to form plasma having a desired composition of radical species. Likewise, RF power supply 114 may provide RF power of any suitable frequency, or group of frequencies, and power.

In some implementations, the plasma ignition and maintenance conditions are controlled with appropriate hardware and/or appropriate machine-readable instructions in a system controller which may provide control instructions via a sequence of input/output control (IOC) instructions. In one example, the instructions for setting plasma conditions for plasma ignition or maintenance are provided in the form of a plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of less than 50 milliseconds, such as 25 milliseconds.

FIG. 1B is a block diagram showing various components of a system utilized to perform a semiconductor fabrication process, according to an implementation 151. In FIG. 1B, RF signal generators 155 and 160 are utilized to generate an excitation signal, which may bring about formation of a plasma within stations 102A, 102B, 102C, and 102D of the process chamber. Stations 102A, 102B, 102C, and 102D may correspond to stations of a semiconductor process chamber, as previously described in reference to FIG. 1A. Thus, in the implementation of FIG. 1B, RF signal generator 155 may generate a relatively low-frequency signal, such as a signal of approximately 400 kHz, while RF signal generator 160 generates a relatively high-frequency signal, such as a signal of approximately 27.12 MHz. It should be noted, however, that these represent merely example frequencies. In other implementations, differing radio frequencies may be generated, and implementations are not limited to 400 kHz and 27.12 MHz signals. For example, in particular instances, a relatively low-frequency may correspond to a frequency of between 360 kHz and 440 kHz. In another instance, a relatively high-frequency may correspond to a frequency of between 26.5 MHz and 27.5 MHz.

In FIG. 1B, an RF transmission line coupling signal generator 155 to low-frequency matching network 158 as well as a radio frequency transmission line coupling signal generator 160 to high-frequency matching network 163 may involve a characteristic impedance of 50 ohms. However, other implementations may utilize transmission lines having differing characteristic impedances, such as 70 ohms, 300 ohms, and so forth. In the implementation of FIG. 1B, low-frequency matching network 158 and high-frequency matching network 163 operate to match the load presented by power divider 170 to the output impedance of signal generator 155 and signal generator 160 (respectively). Such matching brings about an ability to couple maximum power transfer from radio frequency signal generators 155 and 160 to power divider 170. Accordingly, even when power divider 170 presents a highly reactive load (e.g., a complex impedance having a relatively small real component and a large reactive component) maximum power can be transferred from signal generators 155 and 160 to power divider 170. Matching networks 158 and 163 may utilize various reactive components, such as inductors and/or capacitors, which operate to compensate for the highly reactive load that may be presented by power divider 170.

In particular implementations, components of matching networks 158/163 may be arranged so as to match a particular load presented by low-frequency and high-frequency input ports of power divider 170, which may operate to provide plasma-generating power via output ports 171, 172, 173 and 174. However, during plasma-based etching operations or during other plasma-based processes (for example), a load, such as a reactive load presented by the formation of plasma within stations 102A, 102B, 102C, and 102D of a process chamber, may begin to vary or drift. Accordingly, for example, during the initial moments of plasma generation (e.g., the initial 30-60 seconds) output signal amplitudes from ports 171-174 may correspond to substantially equal quantities. However, as plasma generation progresses, output signal amplitudes from ports 171-174 may begin to differ. Such differences may be brought about by changes in reactive loads presented by stations 102A-102D of the process chamber. Thus, in some instances, in response to varying reactive loads presented by stations 102A-102D of the process chamber, actual power coupled from power divider ports 171-174 may vary by values ranging from 0.0% to 25.0%. Additionally, RF power flow to a station can be set to 0.0, or other negligible amount, by way of entering 0.0 Watt as a setpoint. Alternatively, capacitance of a variable capacitor may be adjusted to a value that brings about a current flow that approaches or approximates 0.0 Ampere.

Accordingly, the configuration of FIG. 1B may be categorized as an "open-loop" plasma generation system in that during plasma generation operations, it may be difficult to ensure constant, uniform power transfer from power divider 170 to stations 102A-102D. Thus, without additional controls, such as controls operating to provide real-time, closed-loop tuning of reactive components within low-frequency matching network 158 and high-frequency matching network 163 in response to variances in reactive loads presented by stations 102A-102D, undesirable consequences may result. Such consequences may include under etching, in which an insufficient material is removed from a semiconductor wafer, over etching, in which an excessive amount of material is removed from a semiconductor wafer, for example. In some instances, such under etching and/or over etching may result in a need to scrap an etched semiconductor wafer, resulting in increased cost, schedule delay, and so forth.

Figure 2:
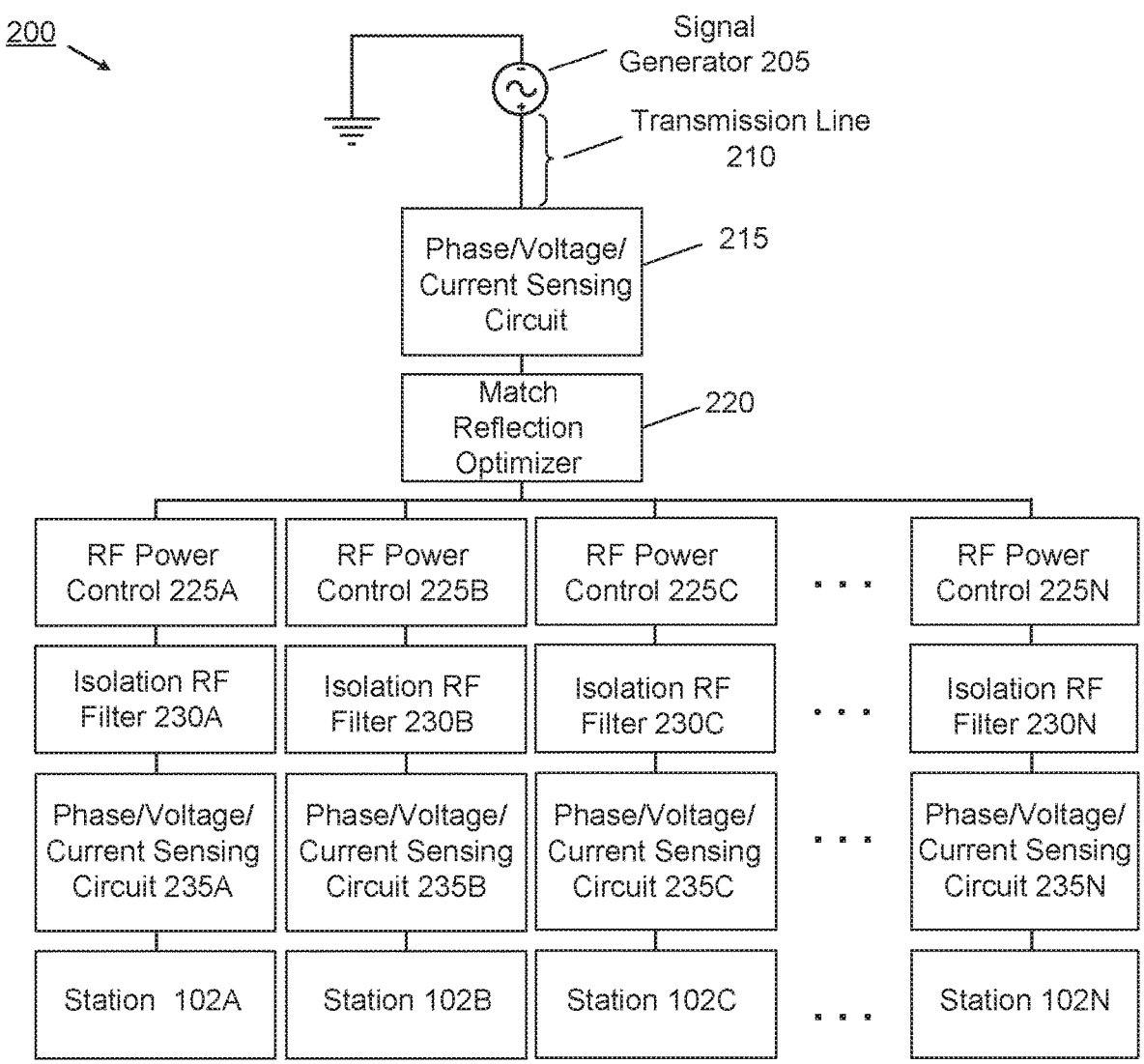
FIG. 2 is a block diagram showing various components of a closed-loop multiple-output radio frequency (RF) matching process used in the performance of a semiconductor fabrication process, according to an implementation.

FIG. 2 is a block diagram showing various components of a closed-loop multiple-output radio frequency (RF) matching process used in the performance of a semiconductor fabrication process, according to an implementation 200. The implementation of FIG. 2 may bring about increased control over power transferred from low-frequency and high-frequency signal generators to a process chamber. Such increased control may be brought about by power flow sensing, which may operate to tune or adjust values of reactive components of matching networks in a manner that permits real-time compensation for changes in reactive impedance presented by process chambers. In response, changes in reactive impedance presented by a process chamber, which may vary during a plasma-enhanced process, may be compensated for, so as to permit maximum power transfer from a signal generator to a process chamber. Additionally, power flow sensing, such as may be accomplished through the use of one or more phase-sensitive voltmeters, may operate in a multichannel environment, such as the environment of FIG. 1B, in which power flow may remain substantially equal across output ports 171, 172, 173, and 174 of a power divider. Further, such techniques may be extended to power dividers having 6 output ports, 8 output ports, 10 output ports, or any other number of output ports, virtually without limitation, which may be coupled to stations of a process chamber, such as coupling to 6 stations, 8 stations, 10 stations, or any number of stations. Of course, an impedance presented by 4 output ports, such as output ports 171, 172, 173, and 174 of FIG. 1B, may be scaled upwards so as to present a parallel combination of approximately 50 ohms. For example, for a power divider comprising 4 output ports, each output port may be matched to a 200-ohm load, so as to present a 50-ohm load at a single input port. In another example, for a power divider comprising 8 output ports, each output port may be matched to a 400-ohm load, so as to present a 50-ohm load at a single input port.

In the implementation of FIG. 2, a plasma-enhanced process may be conducted at stations 102A, 102B, 102C, and 102N of a process chamber. Accordingly, although only 4 stations (102A-102N) are depicted, claimed subject matter is not limited to any particular number of stations of a process chamber. An implementation may include 2 stations, 3 stations, 5 stations 8 stations, and so forth.

Figure 3:
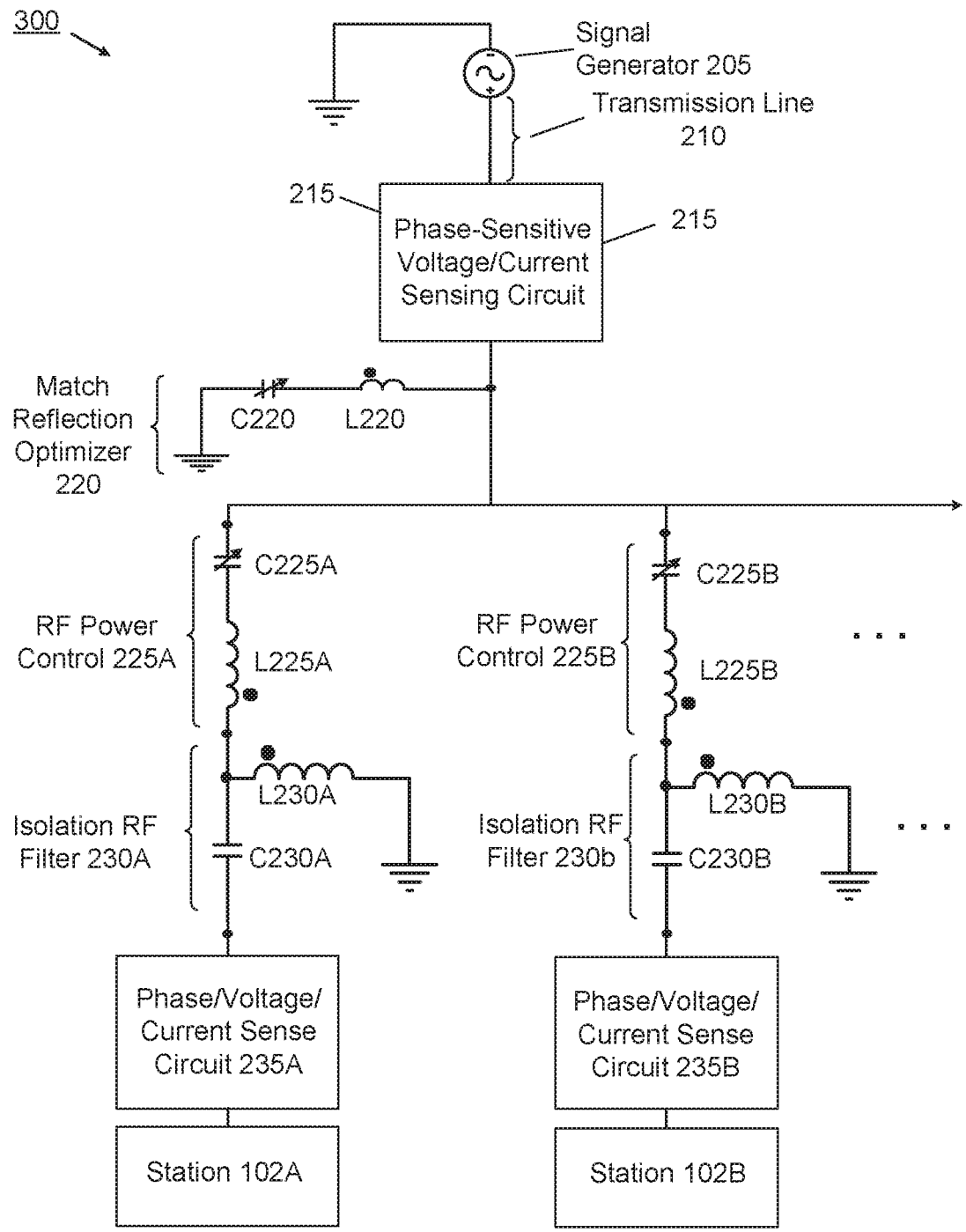
FIG. 3 is a diagram showing various circuit elements utilized in a closed-loop multiple-output RF matching process used in the performance of a semiconductor fabrication process, according to an implementation.

In FIG. 2, signal generator 205 may represent a composite signal generator, such as a signal generator generating two distinct frequencies, such as a low-frequency (e.g., 400.0 kHz) as well as a high frequency (e.g., 27.12 MHz). Accordingly, signal generator 205 may be realized utilizing two or more signal generators, whose outputs may be combined in a power combiner, such as a two-way Wilkinson power combiner. Signal generator 205 may include an output impedance of 50 ohms, which may be coupled to transmission line 210, which may include a characteristic impedance of 50 ohms. Transmission line 210 may be coupled to phase/voltage/current sensing circuit 215, which may operate to provide a feedback signal responsive to an impedance mismatch between transmission line 210 and match reflection optimizer 220. For example, phase/voltage/current sensing circuit 215 may provide a signal to match reflection optimizer 220 to approximately 50 ohms if a voltage standing wave ratio (VSWR) increases beyond a threshold value. Thus, in some implementations, if phase/voltage/current sensing circuit 215 measures a VSWR that increases from, for example, 1.0:1 to 1.15:1, a reactive component of match reflection optimizer 220 may be modified so as to reduce the measured VSWR to a smaller value, such as a value of 1.10:1 or less. It should be noted, however, that a measured VSWR threshold at which a reactive component of match reflection optimizer 220 should be modified may be determined in accordance with a desired application, and implementations are not limited to any particular VSWR threshold or range of VSWR thresholds. Thus, in certain implementations, for example, if a VSWR of greater than 1.10:1 is measured, a reactive component of match reflection optimizer 220 may be adjusted, so as to reduce the measured VSWR to 1.10:1, for example. However, it should be noted that in certain implementations, tuning of reactive components of match reflection optimizer 220 in response to relatively small changes in measured VSWR, such as to bring about a VSWR of less than 1.05:1, for example, may result in excessive tuning of reactive components of match reflection optimizer 220, which may degrade the service life of reactive components. As shown in FIG. 3 herein, a variety of circuit topologies may be utilized in match reflection optimizer 220.

In FIG. 2, a plurality of RF power control circuits 225A-225N are shown as coupling to an output port of match reflection optimizer 220 to an input port of isolation RF filter 230A-230N. In particular implementations, RF power control circuits 225 operate to bring about maximum power transfer between match reflection optimizer 220 and each of stations 102A-102N of a process chamber. In particular implementations, RF power control circuits 225A, in a manner similar to that of match reflection optimizer 220 comprise adjustable reactive components (e.g., capacitors) which bring about maximum power transfer from output ports of match reflection optimizer 220 to input ports of stations 102A-102N of the process chamber. In the implementation of FIG. 2, such adjustment of one or more reactive components of RF power control circuits 225A-225N may be brought about in response to a second measurement of phase-sensitive voltage, such as by way of phase/voltage/current sensing circuit 235A. Thus, in certain implementations, in response to, for example, phase/voltage/current sensing circuit 235A measuring an increase in VSWR at an input port of station 102, sensing circuit 235A may adjust a reactive component of RF power control circuit 225A so as to reduce the VSWR, thereby improving power transfer between RF power control circuit 225A and station 102A. In a similar fashion, phase/voltage/current sensing circuit 235B may operate to adjust one or more reactive components of RF power control circuit 225B.

Likewise, phase/voltage/current sensing circuit 235C may operate to adjust one or more reactive components of RF power control circuit 225C. Likewise, phase/voltage/current sensing circuit 235N may operate to adjust one or more reactive components of RF power control circuit 225N.

Isolation RF filters 230A-230N operate to provide decoupling between low-frequency sources (e.g., 400 kHz sources) from high-frequency sources (e.g., 27.12 MHz), while permitting both signals, at sufficient amplitudes, to be present at station 102A-102N. Thus, as will be seen in reference to FIG. 7, although both low-frequency (e.g., 400 kHz) as well as high-frequency (e.g., 27.12 MHz) may be allowed to interact within a particular station, a RF notch filter to be utilized to substantially isolate low-frequency signals from high-frequency signals, while a high-pass filter may be utilized to substantially isolate high-frequency signals from low-frequency signals.

FIG. 3 is a diagram showing various circuit elements utilized in a closed-loop multiple-output radio frequency matching process used in the performance of a plasma-enhanced process, according to an implementation 300. It should be noted that for purposes of clarity of illustration, only a subset of the components of FIG. 2 are shown in in FIG. 3. However, it may be appreciated that any number of, for example, RF power control circuits (e.g., 225A, 225B), isolation RF filters (e.g., 230A, 230B), phase/voltage/current sensing circuits (e.g., 235A, 235B), and station (e.g., 102A, 102B) may be utilized.

In FIG. 3, match reflection optimizer 220 includes variable capacitors C220 as well as inductor L220. In the implementation of FIG. 3, inductor L220 represents a static component, having a value selected to provide a range of admittances that can be presented by the combination of C220 in series with L220. In particular implementations, C220 represents a variable capacitor having a value that can be controlled via a remote signal, such as a signal from phase/voltage/current sensing circuit 215. Accordingly, in response to phase/voltage/current sensing circuit 215 measuring an increase in inductance (e.g., via measurement of VSWR) presented by the combination of RF power control circuits 225A-225N, a value of capacitance presented by C220 may be adjusted so as to present sufficient admittance to return the measured VSWR to a value below a predetermined threshold (e.g., 1.15:1, 1.10:1, etc.). Such adjustment of capacitors C220 may bring about an increase in power transfer from signal generator 205 to a RF power control circuit (e.g., 225A).

RF power control circuit 225A may additionally include a series impedance, represented by C225A and inductor L225A. Inductor L225A may represent a static component, having a value selected to provide a range of impedances that can be presented by the combination of C225A and L225A. In particular implementations, C225A may represent a variable capacitor having a value that can be controlled via a remote signal, such as a signal from phase/voltage/current sensing circuit 235A. Thus, responsive to phase/voltage/current sensing circuit 235A measuring a change in impedance of station 102A, capacitor C225A may be adjusted, so as to bring about maximum power transfer between match reflection optimizer 220 and stations 102A and 102B.

Figure 4:
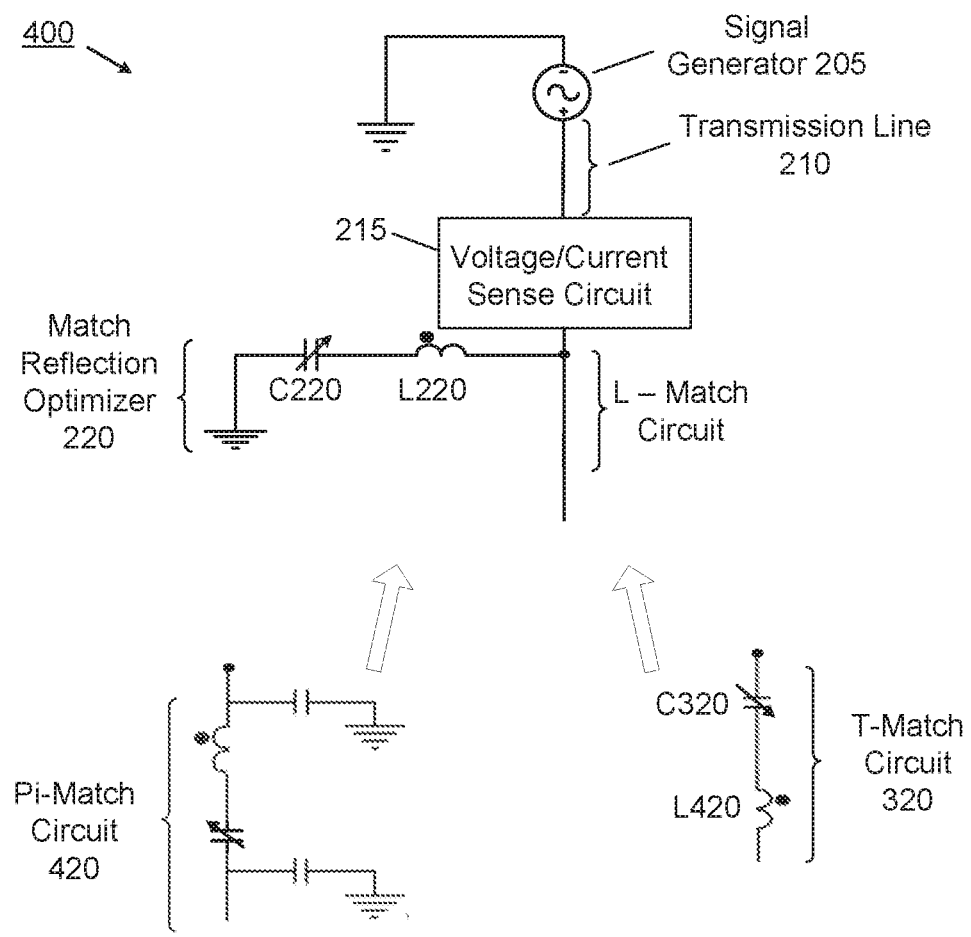
FIG. 4 is a diagram showing circuit elements utilized to perform match reflection optimization in a closed-loop multiple-output RF matching process used in the performance of a semiconductor fabrication process, according to an implementation.

FIG. 4 is a diagram showing circuit elements utilized to perform match reflection optimization in a closed-loop multiple-output radio frequency matching process used in the performance of a semiconductor fabrication process, according to an implementation 400. As previously described in reference to FIG. 3, match circuit reflection optimizer 220, may include a shunt circuit utilizing a relatively fixed value of an inductance and a variable capacitor so as to provide an admittance, which may operate to maximize power transfer from signal generator 205 to RF power control circuit 225A. However, it may be appreciated that although a match reflection optimizer circuit, such as circuit 220, may be particularly suited for matching at higher frequencies, such as 27.12 MHz, other circuit topologies, such as pi-match circuit 420 may operate to provide matching at somewhat lower frequencies, such as 400 kHz. Additionally, under other circumstances, such as when a series impedance may be utilized in lowering VSWR, a T-match circuit may be utilized, such as circuit 320.

Figure 5:
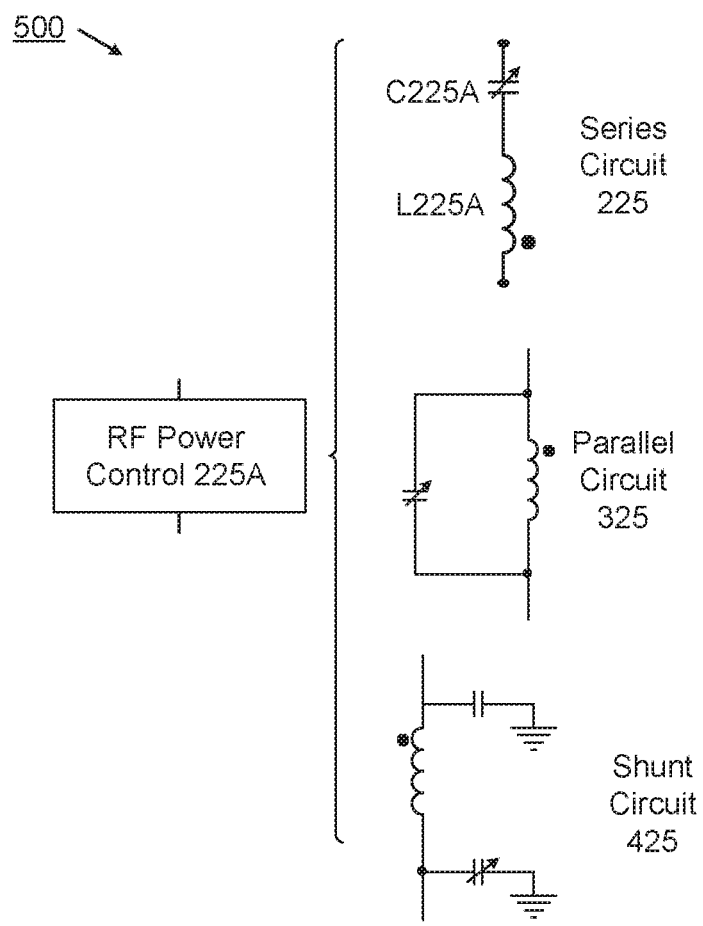
FIG. 5 is a diagram showing circuit elements used to perform RF power control in a closed-loop multiple-output RF matching process, according to an implementation.

FIG. 5 is a diagram showing circuit elements used to perform RF power control in a closed-loop multiple-output radio frequency matching process, according to an implementation 500. The implementation of FIG. 5 may accord with the implementation of FIG. 4, in which various circuit topologies may be utilized according to a frequency at which an impedance match is to be realized (e.g., 400 kHz or 27.12 MHz). It is contemplated that in many instances, a series circuit, such as series circuit 225, having an adjustable capacitance C225A may operate to bring a VSWR measured by phase/voltage/current sensing circuit 235A to a value below a threshold. However, in other instances, it may be advantageous to utilize a parallel circuit, such as parallel circuit 325, to reduce, or otherwise modify, a VSWR measured by phase/voltage/current sensing circuit 235A. In still other instances, it may be advantageous to utilize a shunt circuit, such as shunt circuit 425, to reduce, or otherwise modify, a VSWR measured by phase/voltage/current sensing circuit 235A.

Figure 6:
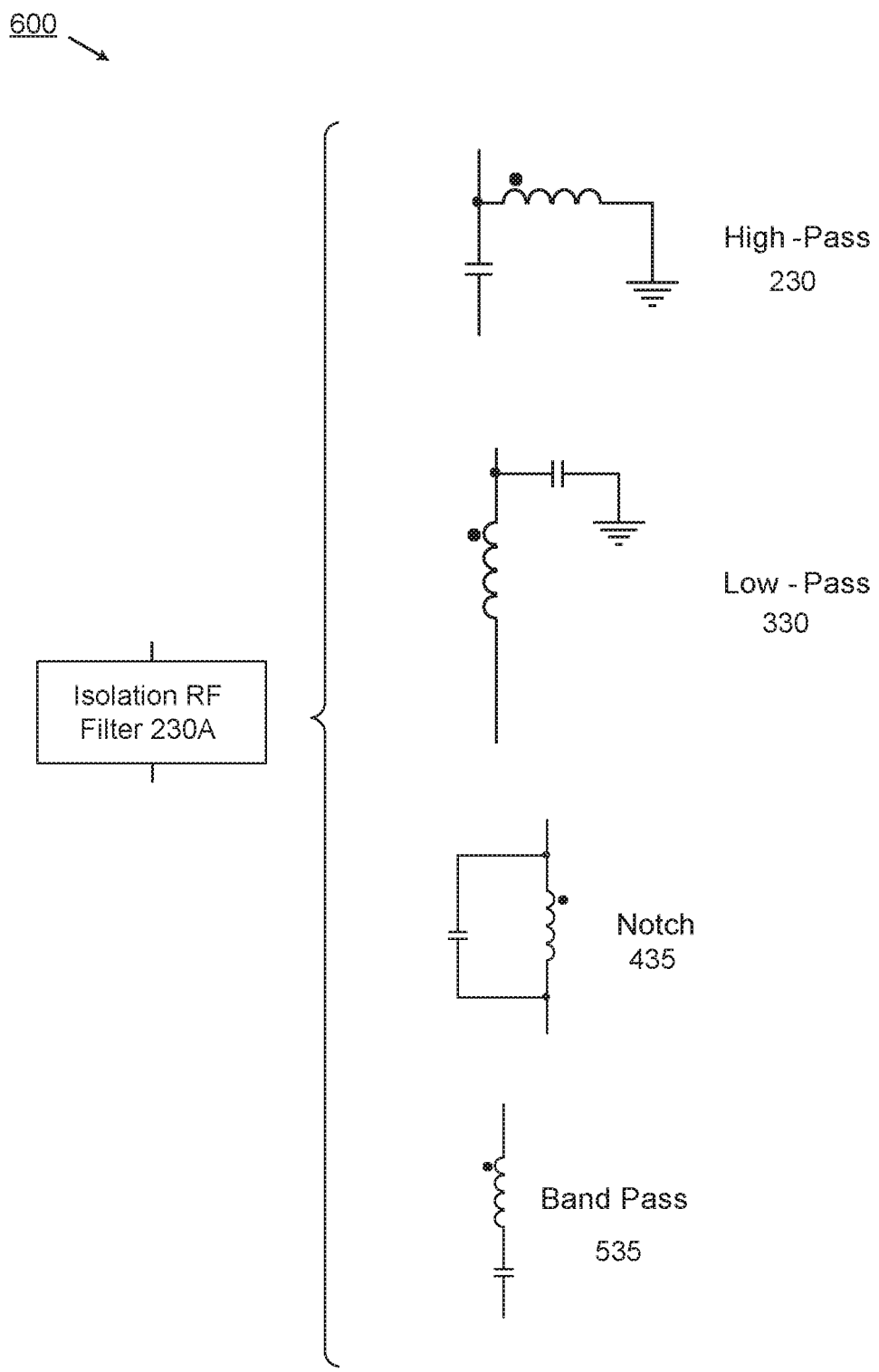
FIG. 6 is a diagram showing circuit elements used to perform RF isolation and filtering in a closed-loop multiple-output RF matching process used in the performance of a semiconductor fabrication process, according to an implementation.

FIG. 6 is a diagram showing circuit elements used to perform RF isolation and filtering in a closed-loop multiple-output radio frequency matching process used in the performance of a semiconductor fabrication process, according to an implementation 600. Similar to that of FIGS. 4 and 5, a variety of circuit topologies may exist in order to provide decoupling between low-frequency sources (e.g., 400 kHz sources) from high-frequency sources (e.g., 27.12 MHz), while permitting both signals, and sufficient amplitude, to be present at station 102A-102N of a process chamber. Accordingly, a circuit designer may make use of high-pass filter 230, low-pass filter 330, notch filter 435, and/or bandpass filter 535 in order to achieve sufficient isolation (such as isolation between 25.0 dB and 35.0 dB).

Figure 7:
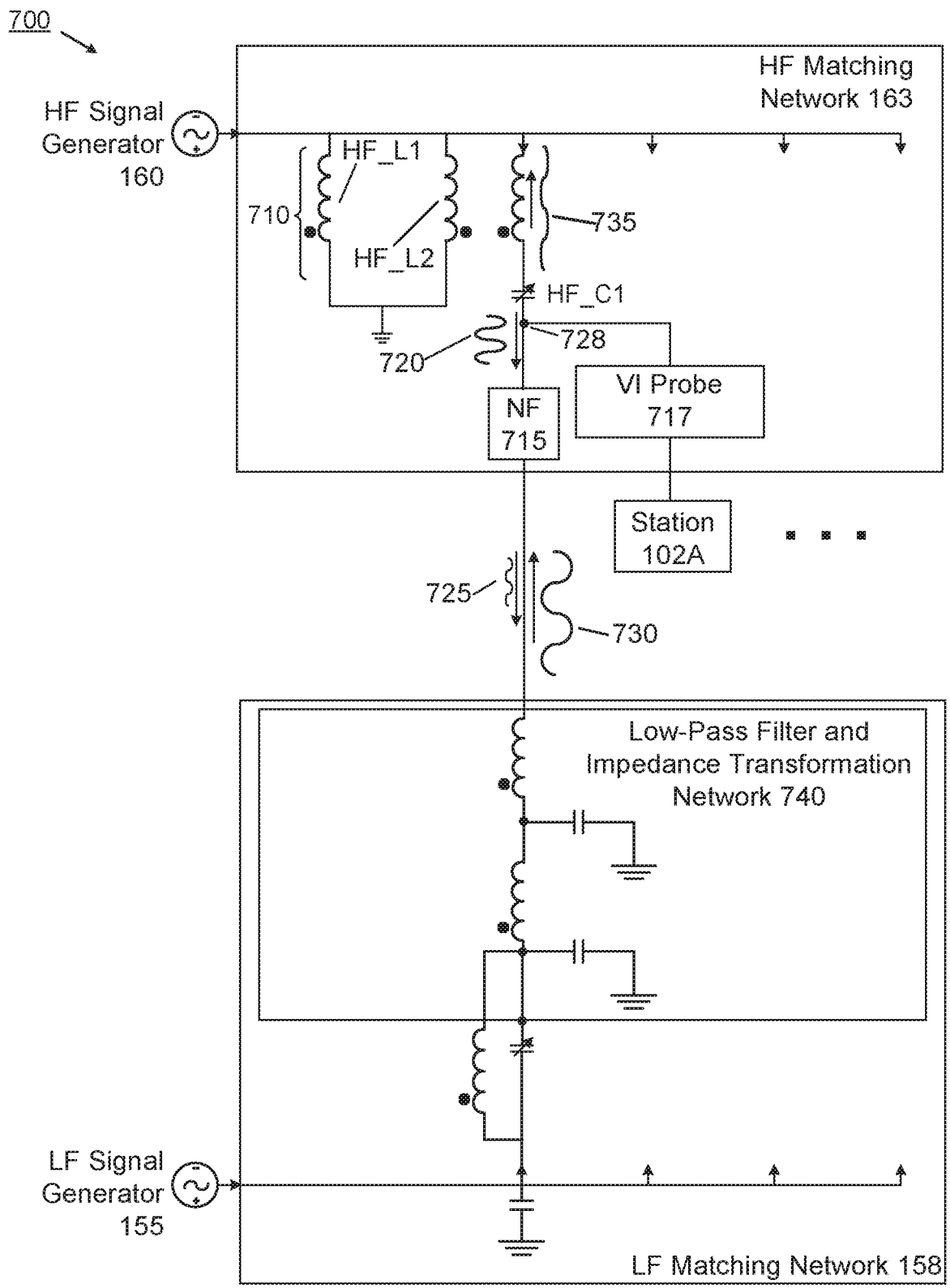
FIG. 7 is a diagram showing circuit elements used to perform matching and/or impedance transformation in a closed-loop multiple-output RF multiple-output matching process used in the performance of a semiconductor fabrication process, according to an implementation.

FIG. 7 is a diagram showing circuit elements used to perform matching and/or impedance transformation in a closed-loop multiple-output radio frequency matching process used in the performance of a semiconductor fabrication process, according to an implementation 700. It may be appreciated that a goal of the circuit elements of FIG. 7 may be to couple signals from high-frequency generator 160 and low-frequency generator 155 to stations, such as station 102A. As previously discussed, stations for performing plasma-based wafer fabrication processes (or other types of semiconductor fabrication processes) may present an impedance having only a small real part along with a relatively high reactive (or imaginary) part. Accordingly, in particular implementations, one purpose of low-frequency matching network 158 and high-frequency matching network 163 is to transform the impedance of process stations (e.g., stations 102-102N of a process chamber) so that such impedances appear to be at least similar to a 50-ohm load. In implementations, such impedance transformations make power transfer possible between signal generators and transmission lines, having 50-ohm characteristic impedances, to highly reactive (e.g., inductive/capacitive) load.

However, it may also be appreciated that it may be problematic, at least in particular implementations, to separate high-frequency signals from low-frequency signals. In particular implementations, if such signals are not isolated (or at least decoupled by between, for example, 25 dB and 40 dB) such cross coupling may interfere with the ability of a signal generator to generate a proper radio frequency signal.

Accordingly, in FIG. 7, a shunt network 710 may be utilized to filter low-frequency components from an output signal port of HF signal generator 160. Accordingly, the values of HF_L1, and HF_L2, shown in parallel at shunt network 710, may be selected so as to shunt low-frequency signals, such as 400 kHz signals, to a local ground. Additionally, capacitor HF_C1 may also be selected so as to present an open circuit (or at least relatively high impedance) to low-frequency signal 730, which may be coupled from low-frequency matching network 158. Thus, in an implementation, signal 730 may be only weakly coupled (as evidenced by low-amplitude signal 735) through the filtering action of capacitor HF_C1. However, as shown in FIG. 7, prior to impinging on capacitor HF_C1, signal 730 may be coupled through VI probe and into station 102A.

Additionally, high-frequency signals from HF match network 163, such as indicated by waveform 720, may be significantly attenuated, such as by an amount of between 25 and 40 dB by way of notch filter (NF) 715. Hence, as shown by waveform 725, high-frequency waveform 720 may be significantly attenuated. However, high-frequency components may be capable of coupling through VI probe 717 and into station 102A. Accordingly, as shown in FIG. 7, at node 728, both high-frequency waveform 720 and low-frequency signal 730 may be permitted to be coupled through VI probe 717 and into station 102A.

Although FIG. 7 depicts a single signal path associated with station 102A, including HF_C1, notch filter (NF) 715 and VI probe 717, it is contemplated that in some implementations, separate signal paths, including separate notch filters and separate VI probe may be replicated in conjunction with additional process stations, such as stations 102B, 102C, and 102D as depicted in FIG. 2. Likewise, although FIG. 7 depicts only a single signal path of low-frequency matching network 158, which includes signal coupling through low-pass filter and impedance transformation network 740, it is contemplated that some implementations would include separate signal paths, such as one signal path for each of process stations 102A, 102B, 102C, and 102D.

Figure 8:
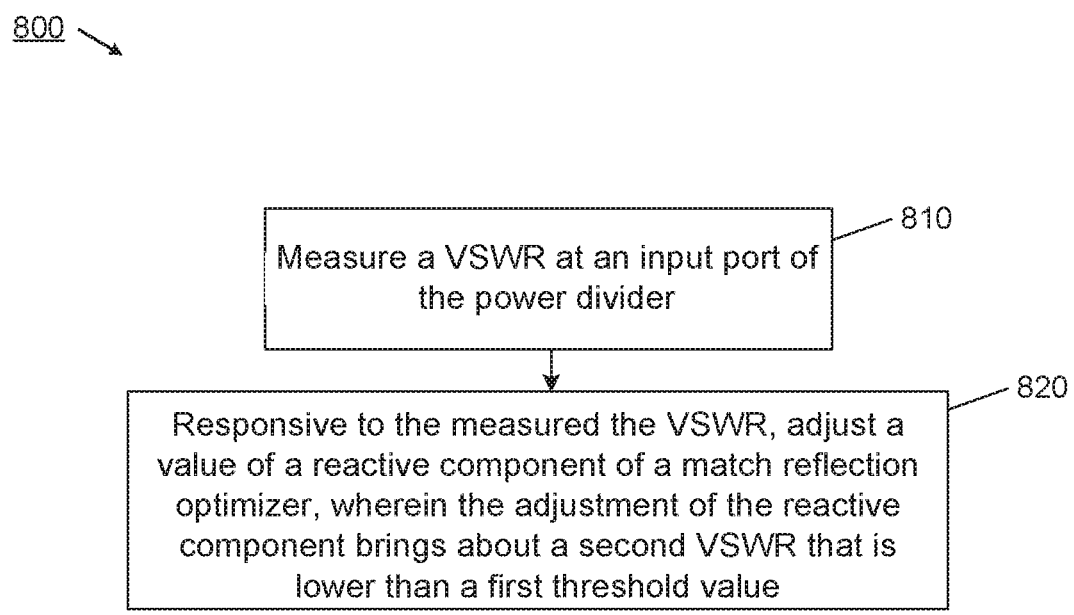
FIG. 8 is a flowchart for a method of closed-loop RF matching, according to an implementation.

FIG. 8 is a flowchart for a method of closed-loop RF matching, according to an implementation. The method of FIG. 8 begins at 810, which comprises measuring a voltage standing wave ratio (VSWR) at an input port of the power divider. The method continues at 820, which comprises, responsive to the measured VSWR, adjusting a value of a reactive component of a match reflection optimizer wherein the adjustment of the reactive component brings about a second VSWR that is lower than a first threshold value.

At 820, the reactive component may correspond to a variable capacitor or may correspond to a variable inductor. Adjustment of the reactive component may bring about a second VSWR that is lower than 1.15:1. However, in some implementations, it may be desirable to lower the second VSWR to a value other than below 1.15:1, such as a value below 1.25:1, below 1.20:1, below 1.10:1, or to a value below 1.05:1. A VSWR may be measured at any number of signal frequencies, such as about 400 kHz, between 360 kHz and 440 kHz, or at another frequency between approximately 50 kHz and 1 MHz. A VSWR may also be measured at a signal frequency of about 27.12 MHz, between about 26.5 MHz and about 27.5 MHz, or at any other signal frequency between approximately 1 MHz and 50 MHz). Measuring a VSWR may take place at an input port of one or more input ports corresponding to stations of the process chamber.

Figure 9:
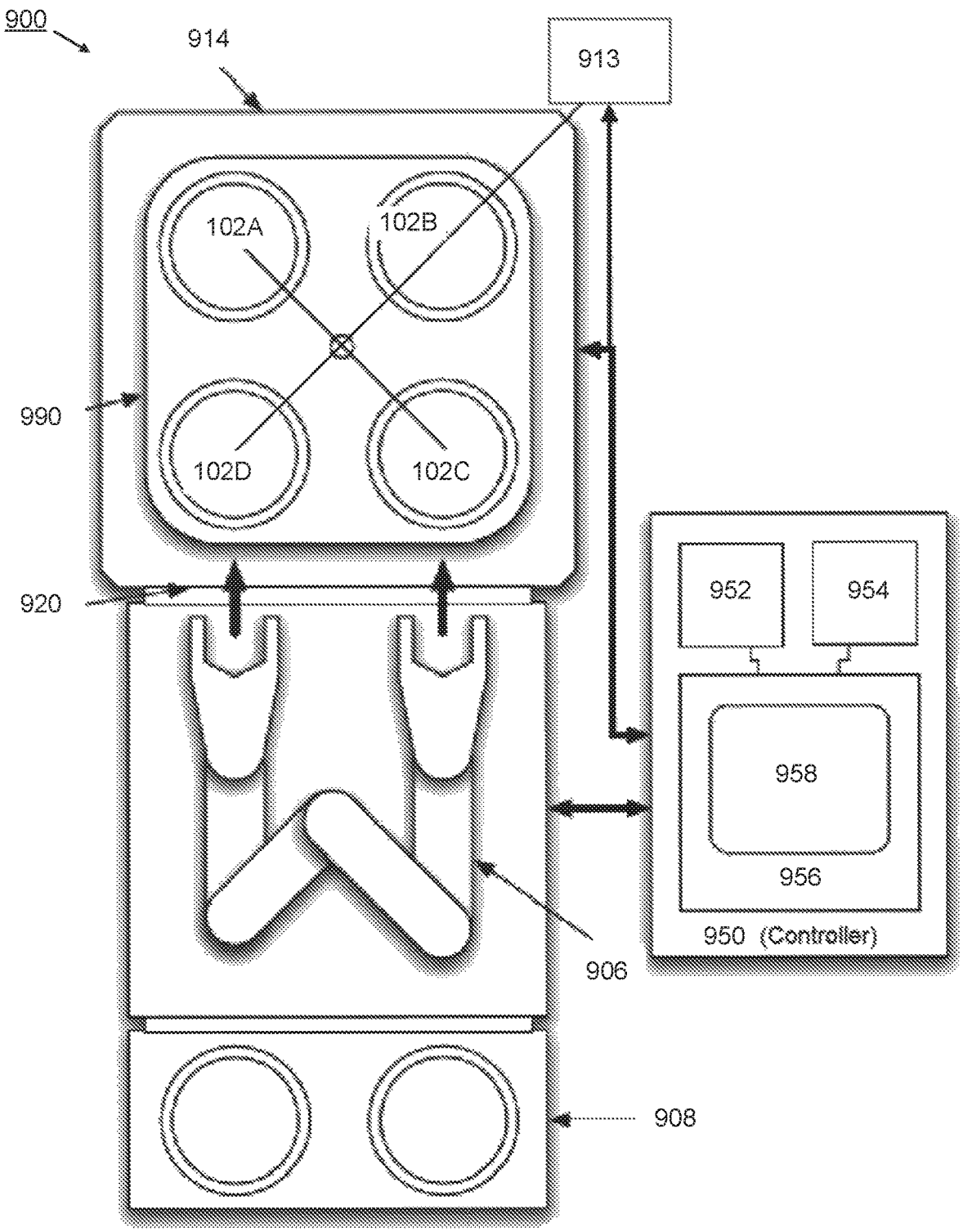
FIG. 9 depicts a schematic view of an implementation of a multi-station processing tool.

One or more process stations may be included in a multi-station processing tool. Thus, FIG. 9 depicts a schematic view of an implementation of a multi-station processing tool 900. The tool 900 employs a single substrate processing chamber 914 that contains multiple substrate process stations, each of which may be used to perform processing operations on a substrate held in a wafer holder, e.g., a pedestal, at that process station. In this particular implementation, the multi-station substrate processing apparatus 900 is shown having four process stations 102A, 102B, 102C, and 102D. Other similar multi-station processing apparatuses may have more or fewer processing stations depending on the implementation and, for instance, the desired level of parallel wafer processing, size/space constraints, cost constraints, etc. Also shown in FIG. 9 are a substrate handler robot 906 and a controller 950.

As shown in FIG. 9, the multi-station processing tool 900 has a substrate loading port 920, and a robot 906 configured to move substrates from a cassette loaded through a pod 908 through loading port 920, into the processing chamber 914, and onto one of the four stations 102A, 102B, 102C, and 102D.

The depicted processing chamber 914 shown in FIG. 9 provides four process stations, 102A, 102B, 102C, and 102D. The RF power is generated at a RF power system 913 and distributed to each of the stations 102A, 102B, 102C, and 102D. The RF power system may include one or more RF power sources, e.g., a high frequency (HFRF) and a low frequency (LFRF) source, impedance matching modules, and filters. In certain implementations, the power source may be limited to only the high frequency or low frequency source. The distribution system of the RF power system may be symmetric about the reactor and may have high impedance. This symmetry and impedance result in approximately equal amounts of power being delivered to each station. In some implementations the RF power system may be configured to independently deliver power to each station.

FIG. 9 also depicts an implementation of a substrate transferring device 990 for transferring substrates between process stations 102A, 102B, 102C, and 102D within processing chamber 914. It will be appreciated that any suitable substrate transferring device may be employed. Non-limiting examples include wafer carousels and wafer handling robots.

System Controller

FIG. 9 also depicts an implementation of a system controller 950 employed to control process conditions and hardware states of process tool 900. System controller 950 may include one or more memory devices 956, one or more mass storage devices 954, and one or more processors 952. Processor 952 may include a CPU or computer, analog and/or digital input/output connections, stepper motor controller boards, etc.

In some implementations, system controller 950 controls all of the activities of process tool 900. System controller 950 executes system control software 958 stored in mass storage device 954, loaded into memory device 956, and executed on processor 952. System control software 958 may include instructions for controlling the timing, mixture of gases, chamber and/or station pressure, chamber and/or station temperature, wafer temperature, target power levels, RF power levels, RF exposure time, substrate pedestal, chuck and/or susceptor position, number of cycles performed on one or more substrates, and other parameters of a particular process performed by process tool 900. These programed processes may include various types of processes including, but not limited to, processes related to determining an amount of accumulation on a surface of the chamber interior, processes related to deposition of film on substrates including numbers of cycles, determining and obtaining a number of compensated cycles, and processes related to cleaning the chamber. System control software 958 may be configured in any suitable way. For example, various process tool component subroutines or control objects may be written to control operation of the process tool components necessary to carry out various process tool processes. System control software 958 may be coded in any suitable computer readable programming language.

In some implementations, system control software 958 may include input/output control (IOC) sequencing instructions for controlling the various parameters described above. For example, each phase of deposition and deposition cycle on a substrate may include one or more instructions for execution by system controller 950. The instructions for setting process conditions for an ALD/CFD deposition process phase may be included in a corresponding ALD/CFD deposition recipe phase. In some implementations, the recipe phases may be sequentially arranged, so that all instructions for a process phase are executed concurrently with that process phase.

Other computer software and/or programs stored on mass storage device 954 and/or memory device 956 associated with system controller 950 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 918 and to control the spacing between the substrate and other parts of process tool 900. The positioning program may include instructions for appropriately moving substrates in and out of the reaction chamber as necessary to deposit films on substrates and clean the chamber.

A process gas control program may include code for controlling gas composition and flow rates and optionally for flowing gas into one or more process stations prior to deposition in order to stabilize the pressure in the process station. In some implementations, the process gas control program includes instructions for introducing gases during formation of a film on a substrate in the reaction chamber. This may include introducing gases for a different number of cycles for one or more substrates within a batch of substrates.

A pressure control program may include code for controlling the pressure in the process station by regulating, for example, a throttle valve in the exhaust system of the process station, a gas flow into the process station, etc. The pressure control program may include instructions for maintaining the same pressure during the deposition of differing number of cycles on one or more substrates during the processing of the batch.

A heater control program may include code for controlling the current to a heating unit that is used to heat the substrate. Alternatively, the heater control program may control delivery of a heat transfer gas (such as helium) to the substrate.

A plasma control program may include code for setting RF power levels, frequencies, and exposure times in one or more process stations in accordance with the implementations herein. In some implementations, the plasma control program may include instructions for using the same RF power levels and/or frequencies and/or exposure times during the deposition of differing number of cycles on one or more substrates during the processing of the batch.

In some implementations, there may be a user interface associated with system controller 950. The user interface may include a display screen, graphical software displays of the apparatus and/or process conditions, and user input devices such as pointing devices, keyboards, touch screens, microphones, etc.

In some implementations, parameters adjusted by system controller 950 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring the process may be provided by analog and/or digital input connections of system controller 950 from various process tool sensors. The signals for controlling the process may be output on the analog and digital output connections of process tool 900. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 950 may provide program instructions for implementing the above-described deposition processes. The program instructions may control a variety of process parameters, such as DC power level, RF bias power level, pressure, temperature, number of cycles for a substrate, amount of accumulation on at least one surface of the chamber interior, etc. The instructions may control the parameters to operate in-situ deposition of film stacks according to various implementations described herein.

For example, the system controller may include control logic for performing the techniques described herein, such as (a) determining an amount of accumulated deposition material currently on at least an interior region of the deposition chamber interior, (b) applying the amount of accumulated deposition material determined in (a), or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior region of the deposition chamber interior, and (c) performing the compensated number of ALD cycles on one or more substrates in the batch of substrates. The system may also include control logic for determining that the accumulation in the chamber has reached an accumulation limit and stopping the processing of the batch of substrates in response to that determination, and for causing a cleaning of the chamber interior.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the number of cycles performed on a substrate, the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In the foregoing detailed description, numerous specific details are set forth to provide a thorough understanding of the presented embodiments or implementations. The disclosed embodiments or implementations may be practiced without some or all of these specific details. In other instances, well-known process operations have not been described in detail so as to not unnecessarily obscure the disclosed embodiments or implementations. While the disclosed embodiments or implementations are described in conjunction with the specific embodiments or implementations, it will be understood that such description is not intended to limit the disclosed embodiments or implementations.

The foregoing detailed description is directed to certain embodiments or implementations for the purposes of describing the disclosed aspects. However, the teachings herein can be applied and implemented in a multitude of different ways. In the foregoing detailed description, references are made to the accompanying drawings. Although the disclosed embodiments or implementation are described in sufficient detail to enable one skilled in the art to practice the embodiments or implementation, it is to be understood that these examples are not limiting; other implementations may be used and changes may be made to the disclosed embodiments or implementation without departing from their spirit and scope. Additionally, it should be understood that the conjunction "or" is intended herein in the inclusive sense where appropriate unless otherwise indicated; for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically includes a diameter of 200 mm, or 300 mm, or 450 mm. The foregoing detailed description assumes embodiments or implementations are implemented on a wafer, or in connection with processes associated with forming or fabricating a wafer. However, the claimed subject matter is not so limited. The work piece may be of various shapes, sizes, and materials. In addition to semiconductor wafers, other work pieces that may take advantage of claimed subject matter may include various articles such as printed circuit boards, or the fabrication of printed circuit boards, and the like.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus for providing signals to stations of a process chamber configured to perform plasma-based semiconductor fabrication processes, comprising:
   a plurality of signal generators configured to generate signals having first and second frequencies;
   a measurement circuit configured to measure a voltage standing wave ratio (VSWR); and
   a match reflection optimizer having a plurality of output ports each corresponding to a station of a plurality of stations of the process chamber, the match reflection optimizer comprising a reactive component configured to be adjusted responsive to an output signal from the measurement circuit.

2. The apparatus of claim 1, wherein the reactive component is configured for adjustment so as to modify the measured VSWR from a first value to a second value.

3. The apparatus of claim 1, wherein the measurement circuit to measure the VSWR corresponds to a phase-sensitive voltage/current measurement circuit.

4. The apparatus of claim 1, wherein the reactive component corresponds to a variable capacitor.

5. The apparatus of claim 1, further comprising a second measurement circuit to measure a second VSWR at one or more input ports of a station of the plurality of stations.

6. The apparatus of claim 1, further comprising an isolation RF filter to provide between 25 and 40 dB of isolation between high-frequency and low-frequency portions of the apparatus.

7. The apparatus of claim 1, wherein the match reflection optimizer is configured to reduce the VSWR to a value of less than a threshold value.

8. The apparatus of claim 7, wherein the threshold value of the VSWR corresponds to 1.15:1.

9. The apparatus of claim 7, wherein the threshold value of the VSWR corresponds to 1.10:1.

10. A method of coupling a plurality of signals from a corresponding number of signal generators to a plurality of stations of a process chamber configured to perform plasma-based semiconductor fabrication processes, the method comprising:
   measuring a voltage standing wave ratio (VSWR) at an input port of a power divider; and
   responsive to the measured VSWR, adjusting a value of a reactive component of a match reflection optimizer having a plurality of output ports each corresponding to a station of the plurality of stations of the process chamber, the adjustment of the reactive component to bring about a second VSWR lower than a first threshold value.

11. The method of claim 10, wherein the reactive component comprises a variable capacitor.

12. The method of claim 10, wherein adjusting the VSWR comprises lowering the VSWR to a value less than 1.15:1.

13. The method of claim 10, wherein the measuring comprises measuring the VSWR of a first signal, having a first frequency of about 400 kHz, and a second signal, having a second frequency of about 27.12 MHz.

14. The method of claim 13, further comprising attenuating the signals having the second frequency, at a signal generator of the first frequency of the plurality of signal generators, by an amount of between 25 and 40 dB.

15. The method of claim 10, further comprising:
   measuring a VSWR at an input port of one or more of the plurality of the stations of the of the process chamber; and
   adjusting a value of a reactive component of a RF power control circuit, the adjustment of the reactive component of the RF power control circuit to bring about a VSWR lower than a second threshold value.

16. The method of claim 10, further comprising adjusting a value of a reactive component of a pi-match circuit to lower the VSWR of a signal at a first frequency of between 360 kHz and 440 kHz.

17. The method of claim 10, further comprising adjusting the value of a reactive component of a L-matching circuit to lower the VSWR at a second frequency of between about 26.5 MHz and about 27.5 MHz.

18. A fabrication chamber for processing semiconductor wafers by performing plasma-based semiconductor fabrication operations, comprising:
   one or more signal generators configured to generate a corresponding number of RF signals to process stations of the fabrication chamber;
   a measurement circuit configured to measure the voltage standing wave ratios (VSWRs) of the RF signals; and
   a control module to control values of reactive components disposed between the one or more signal generators and the process stations of the fabrication chamber, the values of the reactive components configured to be adjusted so as to reduce each of the VSWRs of the RF signals to a value below a threshold VSWR value.

19. The fabrication chamber of claim 18, wherein the threshold value of the VSWR value corresponds to 1.15:1.

20. The fabrication chamber of claim 18, wherein the threshold value of the VSWR value corresponds to 1.10:1.

* * * * *